United States Patent
Liu et al.

(10) Patent No.: US 8,358,065 B2
(45) Date of Patent: Jan. 22, 2013

(54) DISPLAY PANEL PACKAGE STRUCTURE AND FABRICATING METHOD THEREOF

(75) Inventors: Chih-Che Liu, Hsin-Chu (TW); Shih-Feng Hsu, Hsin-Chu (TW)

(73) Assignee: Au Optronics Corporation, Hsin-Chu (TW)

( * ) Notice: Subject to any disclaimer, the term of this patent is extended or adjusted under 35 U.S.C. 154(b) by 0 days.

(21) Appl. No.: 12/871,029

(22) Filed: Aug. 30, 2010

(65) Prior Publication Data
US 2011/0241541 A1 Oct. 6, 2011

(30) Foreign Application Priority Data
Mar. 31, 2010 (TW) .................. 99109942 A

(51) Int. Cl.
*H01J 1/62* (2006.01)
*H01J 63/04* (2006.01)

(52) U.S. Cl. ........ 313/512; 313/483; 313/500; 313/501; 313/502; 313/503; 313/504; 313/505; 313/506

(58) Field of Classification Search .................. None
See application file for complete search history.

(56) References Cited

U.S. PATENT DOCUMENTS

| 7,652,305 B2 | 1/2010 | Chatterjee et al. |
| 2005/0248270 A1 | 11/2005 | Ghosh et al. |
| 2008/0206925 A1* | 8/2008 | Chatterjee et al. ............ 438/106 |
| 2009/0218591 A1* | 9/2009 | Grolier et al. ................. 257/100 |

FOREIGN PATENT DOCUMENTS

| TW | 200729577 | 8/2007 |
| WO | 2008103338 A1 | 8/2008 |

OTHER PUBLICATIONS

English language translation of abstract of TW 200729577 (published Aug. 1, 2007).
Bibliographic data and pertinent parts of WO 2008103338 A1.

* cited by examiner

*Primary Examiner* — Natalie Walford
(74) *Attorney, Agent, or Firm* — McClure, Qualey & Rodack, LLP

(57) ABSTRACT

A display panel package structure is disclosed, which includes a first substrate, a metal wire layer formed on the first substrate, an insulating layer formed on the metal wire layer, a second substrate, a frit formed on an edge of the second substrate for sealing the first substrate and the second substrate, and a conductive layer formed between the frit and the insulating layer corresponding to the frit for conducting a heat when the frit is heated.

8 Claims, 4 Drawing Sheets

DISPLAY PANEL PACKAGE STRUCTURE AND FABRICATING METHOD THEREOF

RELATED APPLICATIONS

This application claims priority to Taiwan Application Serial Number 99109942, filed Mar. 31, 2010, which is herein incorporated by reference.

BACKGROUND

1. Field of Invention

The present invention relates to a package structure and fabricating method of a display panel. More particularly, the present invention relates to a package structure and fabricating method of an organic light emitting diode display panel.

2. Description of Related Art

Various display panels have become popular in daily life, such as a liquid crystal display panel, an organic light emitting diode display panel, a plasma display panel, etc. Those display panels have replaced traditional cathode ray tube (CRT) displays thereby becoming the main stream for displays and are already broadly used in consumer electronic devices or computer products, such as portable televisions, cellular phones, camcorders, laptop computers, desktop displays, projection televisions, etc.

The organic light emitting diode display panel includes a first substrate and a second substrate. The organic light emitting diode devices and the wires are formed on the first substrate. A frit is further disposed on the edge of the second substrate. The frit is heated to seal the first substrate and the second substrate.

However, the wires are formed on the first substrate according to predetermined layout. The path of the wires would be hardly preventing from overlapping the arrangement of the frit. Therefore the power of the laser for heating the frit must be adjusted at different position, and that would increase the difficulty of fabrication and the risk of package failure.

SUMMARY

An aspect of the invention provides a display panel package structure, which includes a first substrate, a metal wire layer formed on the first substrate, an insulating layer formed on the metal wire layer, a second substrate, a frit formed on an edge of the second substrate for sealing the first substrate and the second substrate, and a conductive layer formed between the frit and the insulating layer corresponding to the frit for conducting heat when the frit is heated. The material of the conductive layer can be the same as the material of the metal wire layer. The material of the conductive layer can be selected from a group consisting of Tl, Al, Ni, La, Mo, Cu, and the combination thereof. The material of the conductive layer can be a transparent conductive material. The transparent conductive material can be ITO, Al/ITO, Ag/ITO, or Al—Ni—La/ITO. The display panel package structure can further include a barrier layer disposed between the frit and the conductive layer. The insulating layer can be formed on an edge of the metal wire layer and is disposed between the conductive layer and the metal wire layer. The insulating layer includes plural openings.

Another aspect of the invention provides a method for fabricating a display panel. The method includes providing a first substrate, forming a metal wire layer on the first substrate, forming an insulating layer on the metal wire layer, providing a second substrate, forming a frit on an edge of the second substrate, forming a conductive layer on an edge of the insulating layer corresponding to the frit, covering the second substrate on the first substrate, and heating the frit for sealing the first substrate and the second substrate. The method can further includes forming an anode electrode of an organic light emitting diode, wherein the step of forming the conductive layer and the step of forming the anode electrode of the organic light emitting layer use the same mask. The method can further include forming plural wires on the insulating layer, wherein the wires are insulated from the conductive layer, and the step of forming the conductive layer and the step of forming the wires use the same mask.

The display panel package structure of the present invention provides a conductive layer disposed under the frit. The conductive layer could unify the material under the frit, and the laser power for heating the frit to seal the first substrate and the second substrate can be consistent. The material of the conductive layer is the same as the material of the wires or the material of the anode electrode of the organic light emitting diode, therefore the step of forming the conductive layer can be integrated with the step of forming the wires or the step of forming the anode electrode of the organic light emitting diode by using the same mask. Thus there is no extra step or mask is required.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
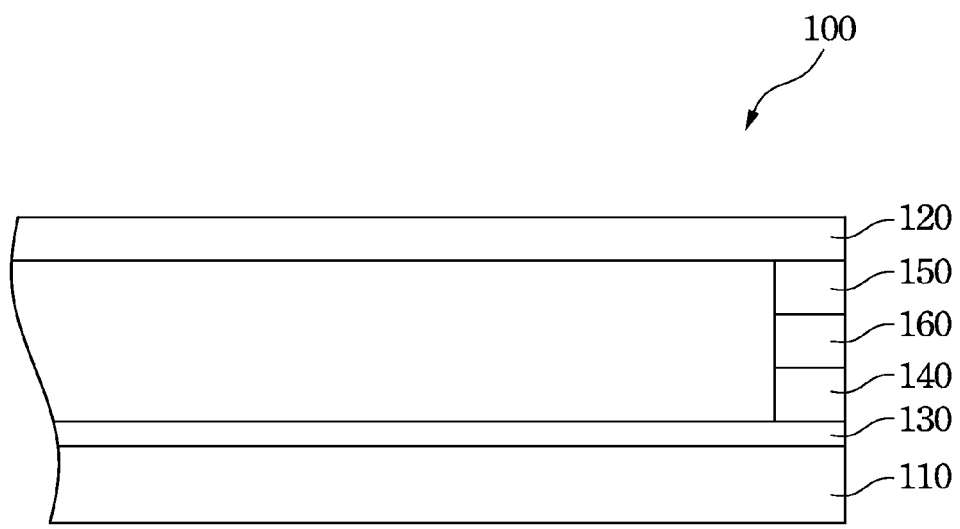
FIG. 1 is a partial schematic diagram of a first embodiment of the display panel package structure of the invention.

Reference will now be made in detail to the present embodiments of the invention, examples of which are illustrated in the accompanying drawings. Wherever possible, the same reference numbers are used in the drawings and the description to refer to the same or like parts.

Refer to FIG. 1. FIG. 1 is a partial schematic diagram of a first embodiment of the display panel package structure of the invention. The display panel package structure 100 includes a first substrate 110, a second substrate 120, a metal wire layer 130 formed on the first substrate 110, an insulating layer 140 formed on the metal wire layer 130, a frit 150 formed on the edge of the second substrate 120, and a conductive layer 160 formed on an edge of the insulating layer 140. The conductive layer 160 corresponds to the frit 150. The insulating layer 140 is disposed on an edge of the conductive layer 160. The insulating layer 140 is disposed between the conductive layer 160 and the metal wire layer 130.

The frit 150 is encircled disposed on the edge of the second substrate 120. The insulating layer 140 and the conductive layer 160 can be arranged encircled as a loop. The frit 150 is heated and melted to seal the first substrate 110 and the second substrate 120. The conductive layer 160 disposed between the frit 150 and the insulating layer 140 would unify the material under the frit 150, thus the power of laser for heating the frit 150 can be consist. Therefore, the power of the laser need not be adjusted according to the layout of the wires of the metal wire layer 130 when the laser passes through the frit 150. The conductive layer 160 may further conduct the heat when the frit 150 is heated, therefore the frit 150 can be heated more equally.

The material of the conductive layer 160 can be the same as the material of the metal wire layer 130. For example, the material of the conductive material can be selected from the group consisting of Ti, Al, Ni, Mo, La, Cu, and the combination thereof. The material of the conductive layer 160 and the metal wire layer 130 can be Al/Ni/La, Ti/Al/La, Mo/Al/Mo, Ti/Al/Mo, or Mo/Al/Ti. The material of the conductive layer 160 and the metal wire layer 130 can be Cu alloy, Al alloy or Mo alloy.

The material of the conductive layer 160 can be a transparent conductive material, such as the material of an anode electrode of the organic light emitting diode. For example, the material of the conductive layer 160 can be Indium Tin Oxide (ITO), Al/ITO, or Al—Ni—La/ITO. The insulating layer 140 can be organic barrier layer.

Figure 2:
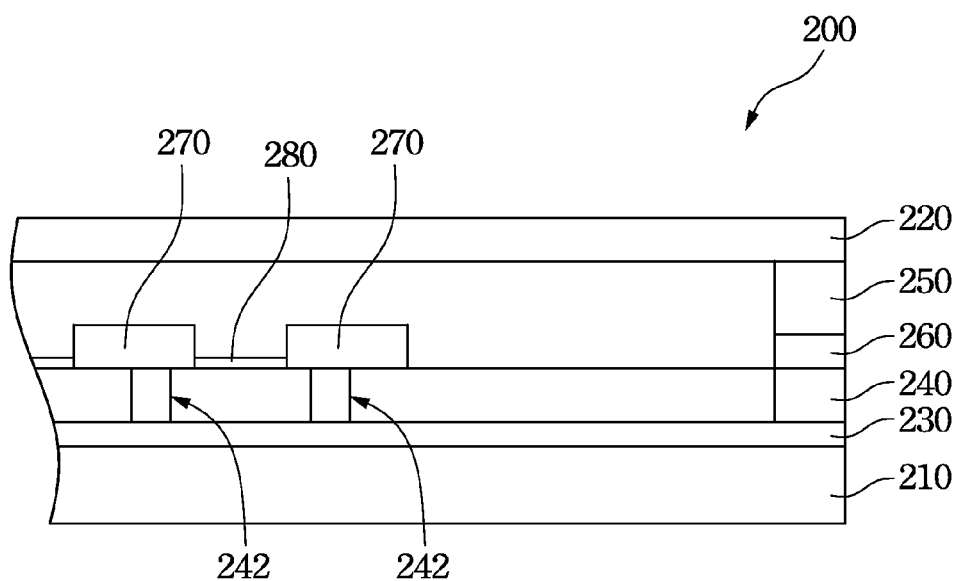
FIG. 2 is a partial schematic diagram of a second embodiment of the display panel package structure of the invention.

Refer to FIG. 2. FIG. 2 is a partial schematic diagram of a second embodiment of the display panel package structure of the invention. The display panel package structure 200 includes a first substrate 210, a second substrate 220, a metal wire layer 230 formed on the first substrate 210, an insulating layer 240 formed on the metal wire layer 230, a frit 250 formed on the edge of the second substrate 220, and a conductive layer 260 formed between the frit 250 and the insulating layer 240.

The frit 250 is encircled disposed on the edge of the second substrate 220. The frit 250 is heated and melted to seal the first substrate 210 and the second substrate 220. The conductive layer 260 disposed between the frit 250 and the insulating layer 240 would unify the material under the frit 250, thus the power of laser for heating the frit 250 can be consist. Therefore, the power of the laser need not be adjusted according to the layout of the wires of the metal wire layer 230 when the laser passes through the frit 250. The conductive layer 260 may further conduct the heat when the frit 250 is heated, therefore the frit 250 can be heated more equally.

The insulating layer 240 in this embodiment covers the surface of the metal wire layer 230. The insulating layer 240 has plural openings 242 to expose the metal wire layer 230 under the insulating layer 240. The devices 270 of the display panel package structure 200 can connect to the metal wire layer 230 via the openings 242 to communicate through the metal wire layer 230 to the devices 270 or external devices. The display panel package structure 200 could further include plural wires 280 formed on the insulating layer 240 for internal connecting the devices 270. The wires 280 are preferably insulated to the conductive layer 260 for preventing the wires 280 form a short circuit.

The material of the conductive layer 260 can be the same as the material of the metal wire layer 230 or the transparent conductive material as disclosed above. The insulating layer 240 can be an organic barrier layer.

Figure 3:
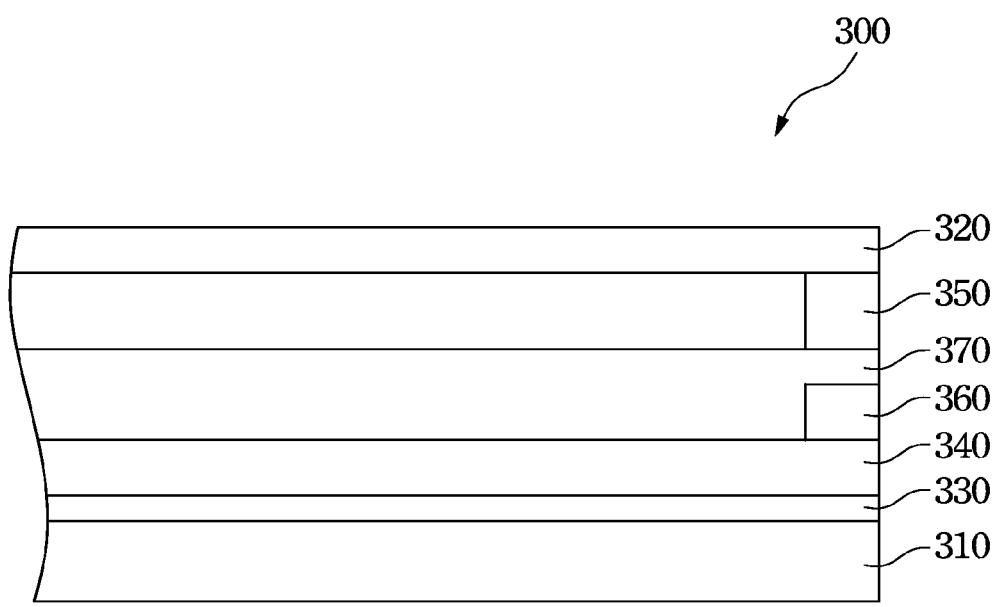
FIG. 3 is a partial schematic diagram of a third embodiment of the display panel package structure of the invention.

Refer to FIG. 3. FIG. 3 is a partial schematic diagram of a third embodiment of the display panel package structure of the invention. The display panel package structure 300 includes a first substrate 310, a second substrate 320, a metal wire layer 330 formed on the first substrate 310, an insulating layer 340 formed on the metal wire layer 330, a frit 350 formed on the edge of the second substrate 320, and a conductive layer 360 formed between the frit 350 and the insulating layer 340. The display panel package structure 300 further includes a barrier layer 370 disposed between the conductive layer 360 and the frit 350.

The frit 350 is encircled disposed on the edge of the second substrate 320. The conductive layer 360 can unify the material under the frit 350. The material of the conductive layer 360 can be the same as the material of the metal wire layer 330 or the transparent conductive material as disclosed above. The insulating layer 340 and the barrier layer 370 can be an organic barrier layer.

Figure 4:
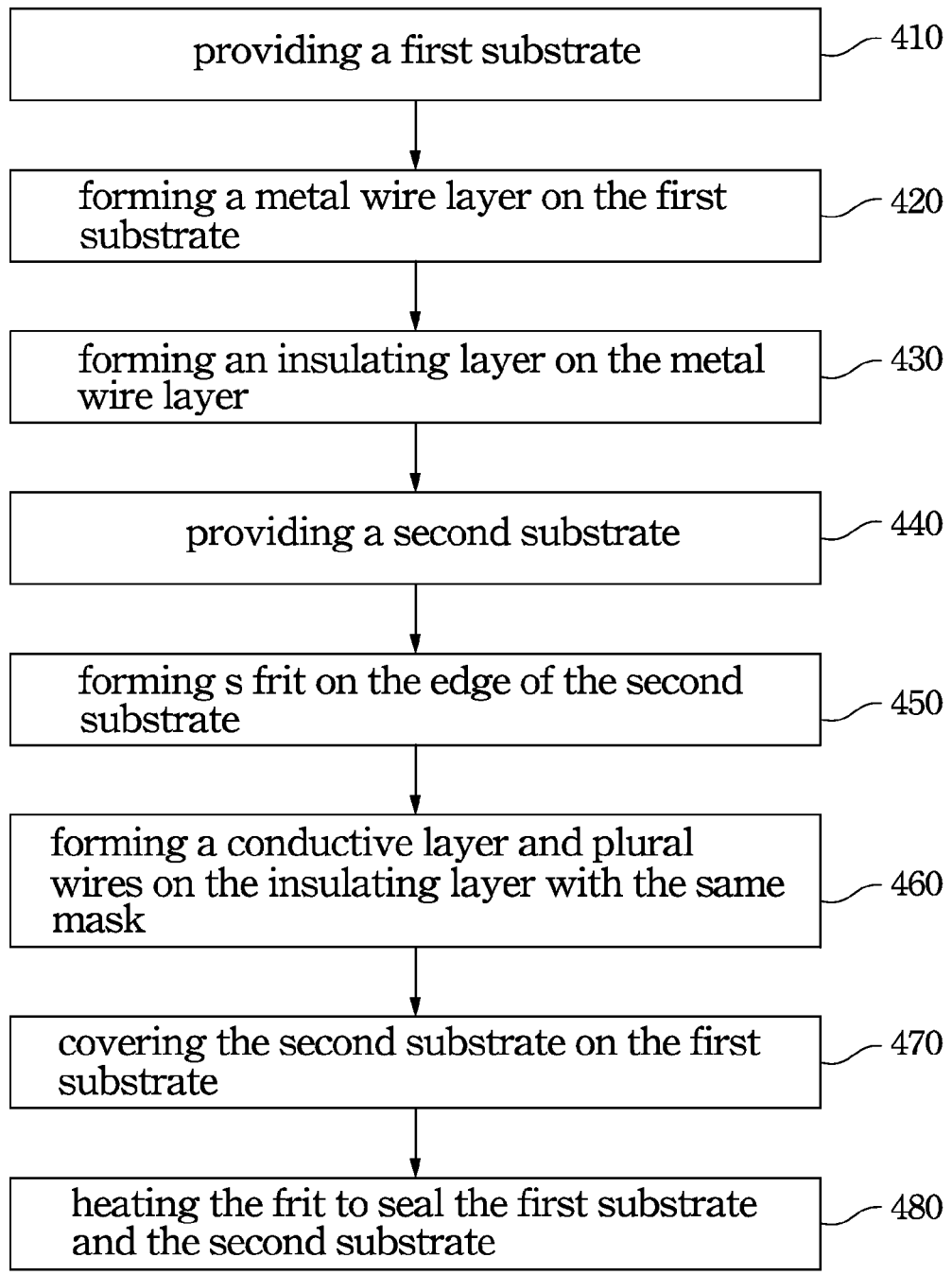
FIG. 4 is a flow chart diagram of a first embodiment of the method for fabricating the display panel of the invention.

Refer to FIG. 4. FIG. 4 is a flow chart diagram of a first embodiment of the method for fabricating the display panel of the invention. Step 410 is providing a first substrate. Step 420 is forming a metal wire layer on the first substrate. Step 430 is forming an insulating layer on the metal wire layer. Step 440 is providing a second substrate. Step 450 is forming a frit on the edge of the second substrate, wherein the frit is encircled and formed on the edge of the second substrate. Step 460 is forming a conductive layer and plural wires on the insulating layer with the same mask. The conductive layer can be encircled and disposed on the edge of the insulating layer corresponding to the frit. The wires are insulated to the conductive layer. Step 470 is covering the second substrate on the first substrate. Step 480 is heating the frit to seal the first substrate and the second substrate.

The material of the conductive layer can be the same as the material of the wires, therefore the step of forming the wire and the step of forming the conductive layer can use the same mask and be integrated in Step 460. Thus the fabricating steps and the cost for making and using the mask can be reduced.

Figure 5:
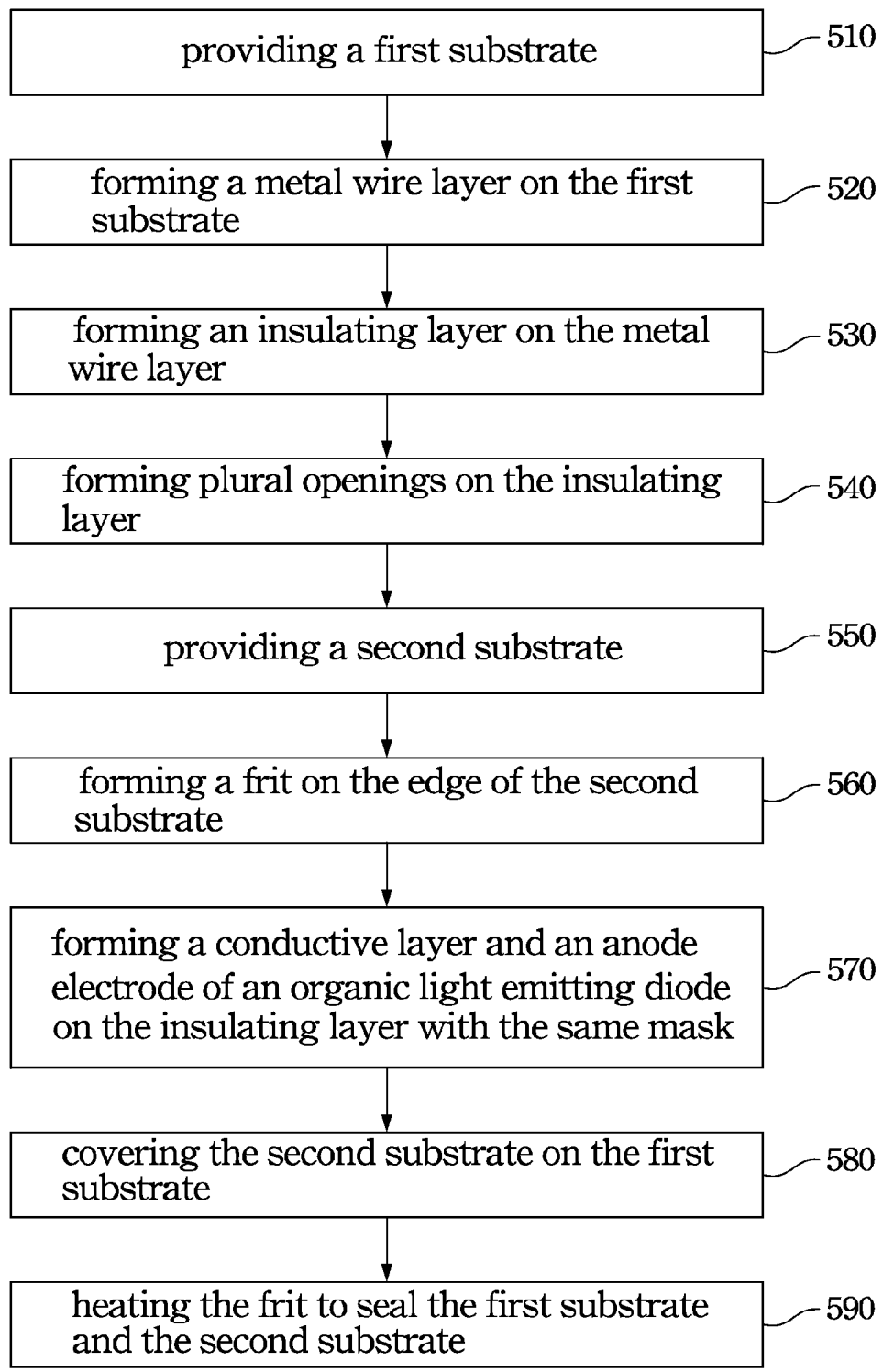
FIG. 5 is a flow chart diagram of a second embodiment of the method for fabricating the display panel of the invention.

Refer to FIG. 5. FIG. 5 is a flow chart diagram of a second embodiment of the method for fabricating the display panel of the invention. Step 510 is providing a first substrate. Step 520 is forming a metal wire layer on the first substrate. Step 530 is forming an insulating layer on the metal wire layer. Step 540 is forming plural openings on the insulating layer. Step 550 is providing a second substrate. Step 560 is forming a frit on the edge of the second substrate, wherein the frit is encircled and formed on the edge of the second substrate. Step 570 is forming a conductive layer and an anode electrode of an organic light emitting diode on the insulating layer with the same mask. The conductive layer can be encircled disposed on the edge of the insulating layer corresponding to the frit. A part of the anode electrode of the organic light emitting diode is formed in the openings of the insulating layer. Step 580 is covering the second substrate on the first substrate. Step 590 is heating the frit to seal the first substrate and the second substrate.

The material of the conductive layer can be the same as the material of the anode electrode of the organic light emitting diode. Therefore the step of forming the conductive layer and the step of forming the anode electrode of the organic light emitting diode can use the same mask and be integrated in Step 570. Thus the fabricating steps and the cost for making and using the mask can be reduced.

The display panel package structure of the present invention provides a conductive layer disposed under the frit. The conductive layer could unify the material under the frit, and the laser power for heating the frit to seal the first substrate and the second substrate can be consist. The material of the conductive layer is the same as the material of the wires or the material of the anode electrode of the organic light emitting diode, therefore the step of forming the conductive layer can be integrated with the step of forming the wires or the step of forming the anode electrode of the organic light emitting diode by using the same mask. Thus there is no extra step or mask is required.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A display panel package structure comprising:
   a first substrate;
   a metal wire layer formed on the first substrate;
   an insulating layer formed on the metal wire layer;
   a second substrate;
   a frit formed on an edge of the second substrate for circumferentially sealing the first substrate and the second substrate; and
   a conductive layer circumferentially formed on the insulating layer and disposed between the frit and the insulating layer for conducting heat when the frit is heated, wherein the conductive layer contacts the frit directly.

2. The display panel package structure of claim 1, wherein the material of the conductive layer is the same as the material of the metal wire layer.

3. The display panel package structure of claim 2, wherein the material of the conductive layer is selected from a group consisting of Tl, Al, Ni, La, Mo, Cu, and the combination thereof.

4. The display panel package structure of claim 1, wherein the material of the conductive layer is a transparent conductive material.

5. The display panel package structure of claim 4, wherein the transparent conductive material is ITO, Al/ITO, Ag/ITO, or Al-Ni-La/ITO.

6. The display panel package structure of claim 1, further comprising a barrier layer disposed between the frit and the conductive layer.

7. The display panel package structure of claim 1, wherein the insulating layer is formed on an edge of the metal wire layer and is disposed between the conductive layer and the metal wire layer.

8. The display panel package structure of claim 1, wherein the insulating layer comprises a plurality of openings.

* * * * *